United States Patent [19]
Japp et al.

[11] Patent Number: 6,073,344
[45] Date of Patent: Jun. 13, 2000

[54] LASER SEGMENTATION OF PLATED THROUGH-HOLE SIDEWALLS TO FORM MULTIPLE CONDUCTORS

[75] Inventors: Robert M. Japp, Vestal; John S. Kresge, Binghamton, both of N.Y.

[73] Assignee: International Business Machines Corporation, Armonk, N.Y.

[21] Appl. No.: 09/239,384

[22] Filed: Jan. 28, 1999

[51] Int. Cl.[7] .................................................. H05K 3/36
[52] U.S. Cl. ................................. 29/830; 29/840; 29/852
[58] Field of Search ............................. 29/830, 840, 852

[56] References Cited

U.S. PATENT DOCUMENTS

| | | | |
|---|---|---|---|
| 3,349,480 | 10/1967 | Rashleigh . | |
| 4,660,063 | 4/1987 | Anthony | 357/25 |
| 4,711,026 | 12/1987 | Swiggett et al. | 29/850 |
| 4,859,807 | 8/1989 | Swiggett et al. | 174/68.5 |
| 5,096,849 | 3/1992 | Beilstein, Jr. et al. | 437/67 |
| 5,104,684 | 4/1992 | Tao et al. | 427/38 |
| 5,126,532 | 6/1992 | Inagawa et al. | 219/121.7 |
| 5,196,376 | 3/1993 | Reche | 437/225 |
| 5,455,998 | 10/1995 | Miyazono et al. | 29/611 |
| 5,487,218 | 1/1996 | Bhatt et al. | 29/852 |
| 5,569,398 | 10/1996 | Sun et al. | 219/121.68 |
| 5,613,858 | 3/1997 | Estes et al. | 439/46 |
| 5,811,019 | 9/1998 | Nakayama et al. | 216/27 |
| 5,856,636 | 1/1999 | Sanso | 174/255 |
| 5,881,455 | 3/1999 | Kobayashi et al. | 29/852 |
| 5,906,042 | 5/1999 | Lan et al. | 29/852 |

FOREIGN PATENT DOCUMENTS

| | | |
|---|---|---|
| 2323529 | of 1973 | Germany . |
| 4-348591 | of 1992 | Japan . |

*Primary Examiner*—Lee Young
*Assistant Examiner*—Kevin G. Vereene
*Attorney, Agent, or Firm*—Schmeiser, Olsen & Watts; Lawrence R. Fraley

[57] ABSTRACT

A method for generating multiple conductor segments within a plated through hole of a printed circuit board. The method utilizes laser light to define the segmented surfaces bounding a hole in a circuit board. Two embodiments of this method are a subtractive process and an additive process. The subtractive process starts with a plated through hole and uses a laser to removes vertical strips of the PTH conductive lining to form the multiple conductive segments. The additive process applies a seeding material to a bare hole in a circuit board, removes vertical strips of the seeding material via laser scanning, and applies an electrically conductive material to the seeded surfaces to form the multiple conductive segments.

22 Claims, 7 Drawing Sheets

LASER SEGMENTATION OF PLATED THROUGH-HOLE SIDEWALLS TO FORM MULTIPLE CONDUCTORS

BACKGROUND OF THE INVENTION

1. Technical Field

The present invention relates to a technique for generating multiple conductor segments within a plated through hole of a printed circuit board.

2. Related Art

Contemporary printed circuit boards require high-density wiring circuitry for accommodating the wiring requirements of particular chips which are affixed to the circuit board. Although a plated-through hole (PTH) provides a mechanism for coupling a chip to circuitry on or within the circuit board, current PTH technology allows only one signal conductor to utilize a PTH. Since each PTH occupies valuable area on the surface of a circuit board, the number of PTHs that can be fabricated within a given area on the circuit board is limited, which in turn places a ceiling on the maximum number of possible wiring connections within the given area.

While reducing PTH diameter increases the number of PTHs that can be fabricated, process and reliability considerations impose a practical limit as to how small a PTH can be. First, the drilling of holes becomes increasingly difficult as hole size decreases. Second, the plating of a hole to create a PTH becomes more difficult and less reliable as the aspect ratio (hole depth/hole diameter) increases. Third, the durability of the PTH due to thermal cycling diminishes as the PTH diameter decreases. As temperature is varied, thermal stresses within the PTH are induced by the difference in the coefficient of thermal expansion of the conductive plating on the PTH and the adjacent dielectric material of the circuit board.

Thus, there is a need to improve wireability of printed circuit boards while maintaining acceptable reliability of PTHs.

SUMMARY OF THE INVENTION

The present invention provides a method of improving the wireability of printed circuit boards by generating multiple electrically conductive segments within a PTH. The multiple conductive segments are oriented in the direction of the circuit board thickness, which enables multiple circuits to be circumferentially coupled to the PTH with an associated increase in wiring density as compared with an unsegmented PTH. Although multiple segmentation requires an increase in PTH diameter which causes a PTH to occupy more circuit board surface area, the increased wireability has the potential of reducing the required number of PTHs and of causing an overall improvement in circuit board area utilization. Moreover, the larger PTH diameter mitigates the aforementioned process and reliability problems associated with small PTH diameters.

Two embodiments of the present invention are a subtractive process and an additive process. In the subtractive process, vertical strips of conductive lining of a PTH are removed by ablative laser scanning so as to generate conductive segments within the PTH separated by nonconductive gaps on the PTH wall. The conductive segments may be electrically coupled to circuitry on exterior surfaces of the circuit board or to a circuit pattern within an internal layer within the circuit board. The laser process generates debris of conductive particles which may be deposited on nonconductive surfaces within the PTH. With the subtractive process, the debris is removed and the PTH is filled with a nonconductive material in order to secure the conductive segments in place.

In the additive process, electrically conductive matter is added to a hole within a circuit board by a technique that causes the conductive matter to adhere to isolated segments on the hole wall. The process starts with a circuit board comprising electrically insulating material. After a hole is drilled in the circuit board, the hole is coated with seeding material, wherein the seeding material is bondable with an electrically conductive material. Vertical strips of the seeding material are then removed by laser ablative scanning so as to generate alternating seeded segments and unseeded gaps on the hole wall. Next, the hole wall is plated with an electrically conductive material, wherein the electrically conductive material adheres to only the seeded surfaces such that a plurality of electrically isolated conductive segments are formed on the hole wall. The hole is then filled with a nonconductive material in order to secure the conductive segments in place.

The present invention has the advantage of improving the wireability of a printed circuit board.

The present invention has the advantage of enabling multiple circuits to be circumferentially coupled to a PTH.

The present invention has the advantage of reducing the number of PTHs required for a given application.

The present invention has the advantage of conserving surface area on the surface of a printed circuit board.

The present invention has the advantage of enabling PTHs to have a larger diameter, which offers the benefits of making it easier to drill the hole for the PTH, improving the reliability of the plating of the hole in fabricating the PTH, and mitigating the adverse effect of thermal cycling on the durability of the PTH.

DETAILED DESCRIPTION OF THE INVENTION

The present invention is a method for generating multiple conductive segments within a PTH. This description presents two preferred embodiments: a subtractive process and an additive process. FIGS. 1–5 relate to the subtractive process and FIGS. 6–11 relate to the additive process.

Figure 1:
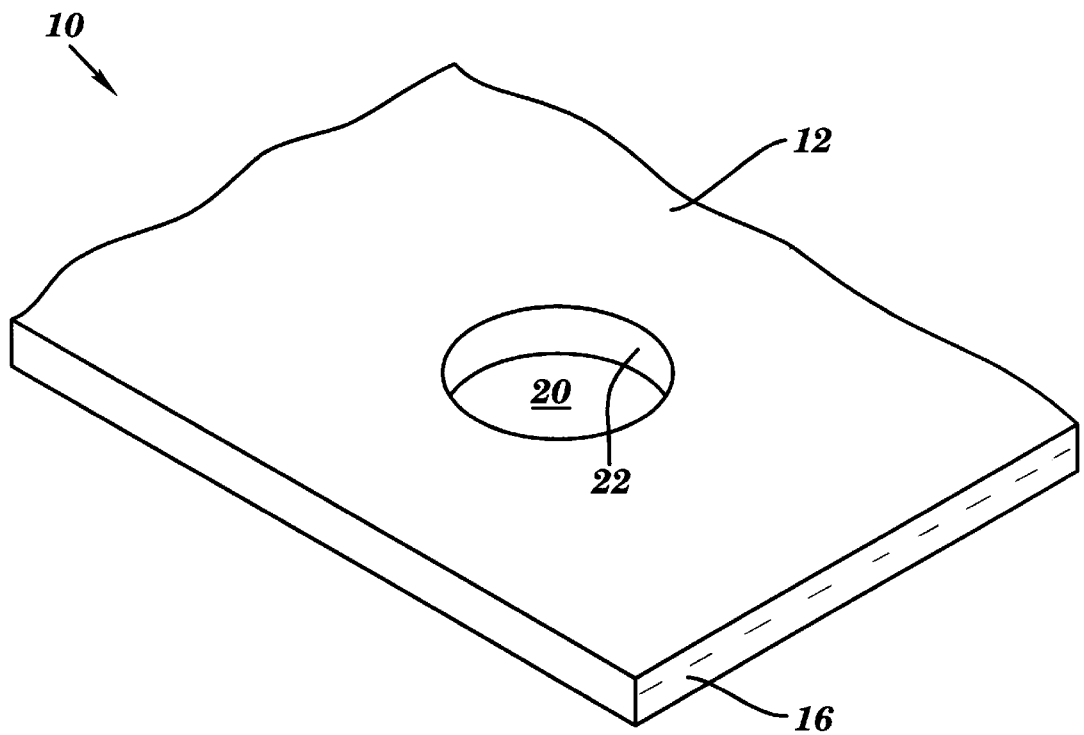
FIG. 1 depicts a top perspective view of a simplified circuit board with a hole in accordance with the subtractive process embodiment of the present invention.

FIG. 1 relates to the subtractive process and illustrates a top perspective view of a substrate 10 having a first surface 12, an internal layer 16, and a hole 20 circumscribed by a hole wall 22. The first surface 12, internal layer 16, and hole wall 22 each comprise electrically insulative material. The first surface 12 is coated with a first electrically conductive material (not shown), such as copper, for the purpose of subsequently circuitizing the first surface 12. Circuitization of the first surface 12 is optional. Thus, generation of multiple conductive segments in the PTH may be accomplished as described herein even if the first surface 12 is not coated with the first electrically conductive material. The order of drilling the hole and coating with the first electrically conductive material is immaterial.

Figure 2:
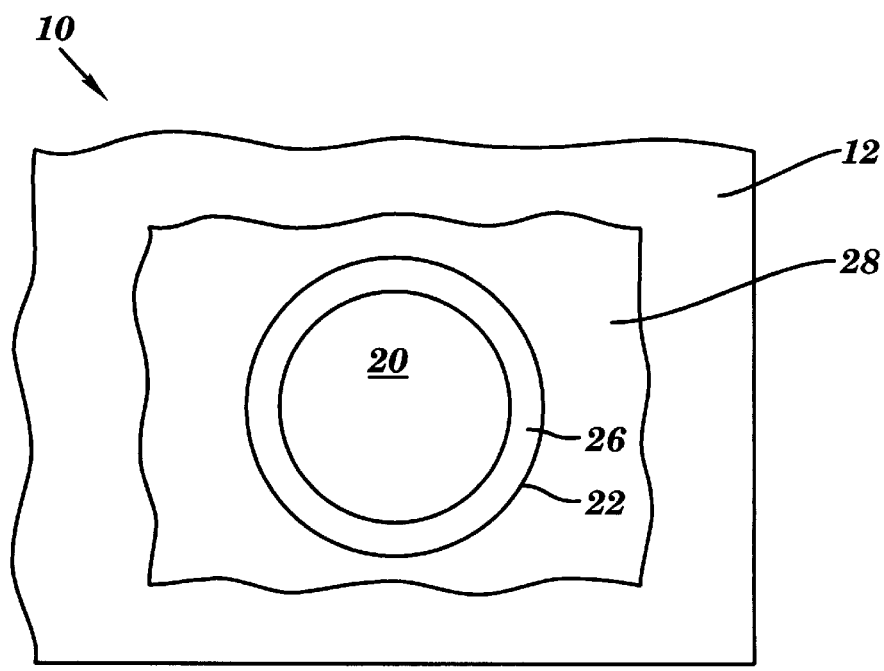
FIG. 2 depicts a top view of the circuit board of FIG. 1 following plating with conductive material.

Referring to the top view of the substrate depicted in FIG. 2, the first surface 12 and the hole wall 22 are plated with a second electrically conductive material, such as copper, to form a conductive surface 26 on the hole wall 22 and a conductive layer 28 on the first surface 12. The plating of the hole wall 22 and the first surface 12 may be accomplished simultaneously by a process comprising immersing the substrate 10 in a bath of the second electrically conductive material. Alternatively, the hole surface 22 and the first surface 12 may be plated independently. The first surface 12 may be circuitized in any manner after being plated.

Figure 3:
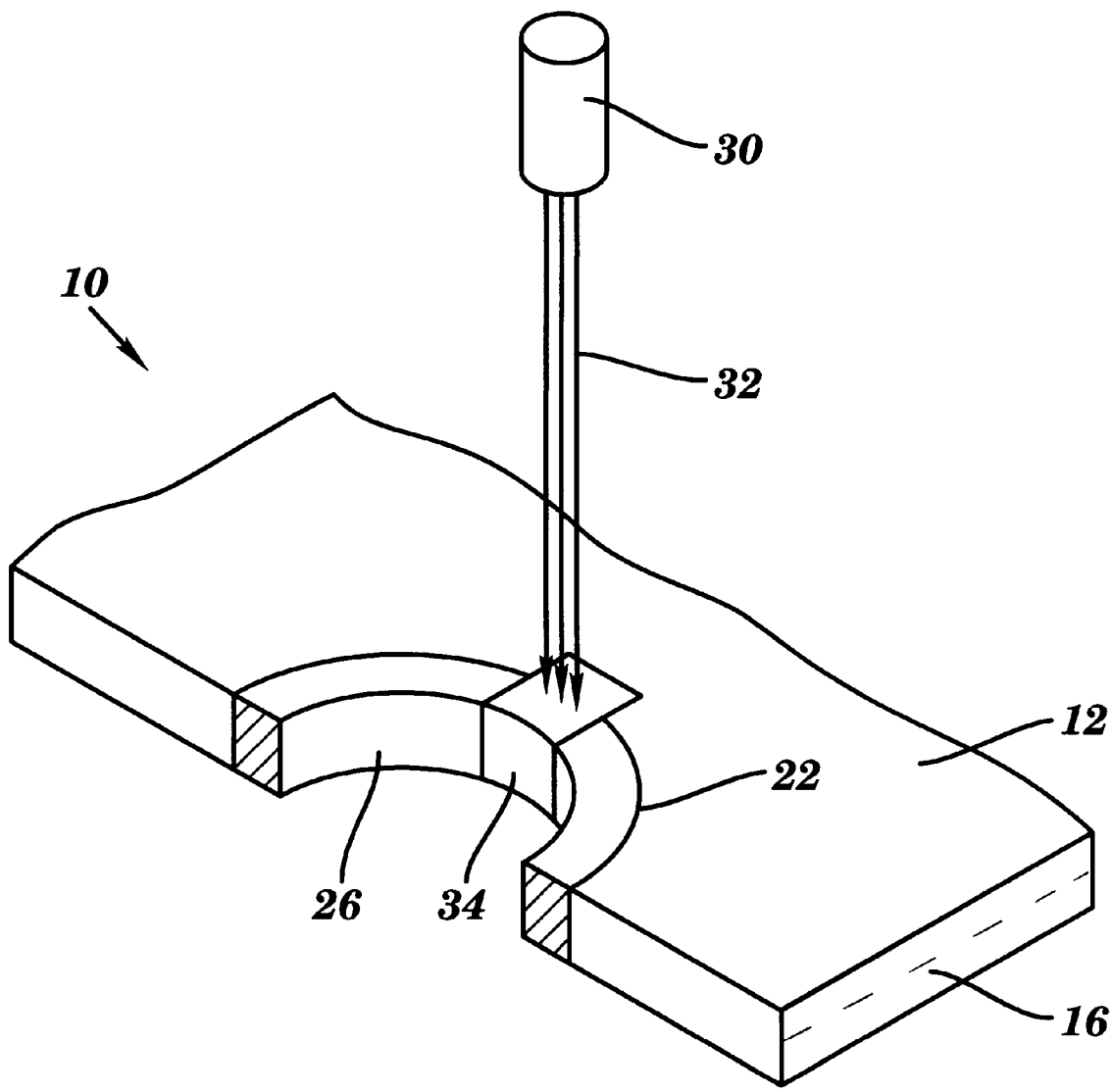
FIG. 3 depicts an isometric cross-sectional view of the circuit board of FIG. 1 at the onset of laser scanning.

FIG. 3 depicts an isometric cross-sectional view of the conductive surface 26 after plating of the hole wall 22 and (optionally) the first surface 12. In FIG. 3, a vertical strip 34 within the conductive surface 26 is removed by a beam of light 32 directed from a laser 30 onto the vertical strip 34. Although the vertical strip 34 is shown in FIG. 3 as rectangular, the vertical strip 34 may have a semicircular shape or any other shape. Prior to its removal, the vertical strip 34 is an integral part of conductive surface 26.

Any of a variety of lasers may be used provided that the laser is capable of cleanly removing the vertical strip 34. The preferred embodiment utilizes a yag laser operating at: 2400 Hz, 355 nanometer wave length, 400 milliwatt average power, 17 micron spot size, 50 micron scan diameter, and 12 mm/sec scan speed. One mil of copper conductive material may be removed with 10 scan repetitions of the yag laser. Thus, 200 scans removes a 20 mil thickness of copper in approximately one second (i.e., 200 scans * 50 microns /(12 mm/sec)).

Figure 4:
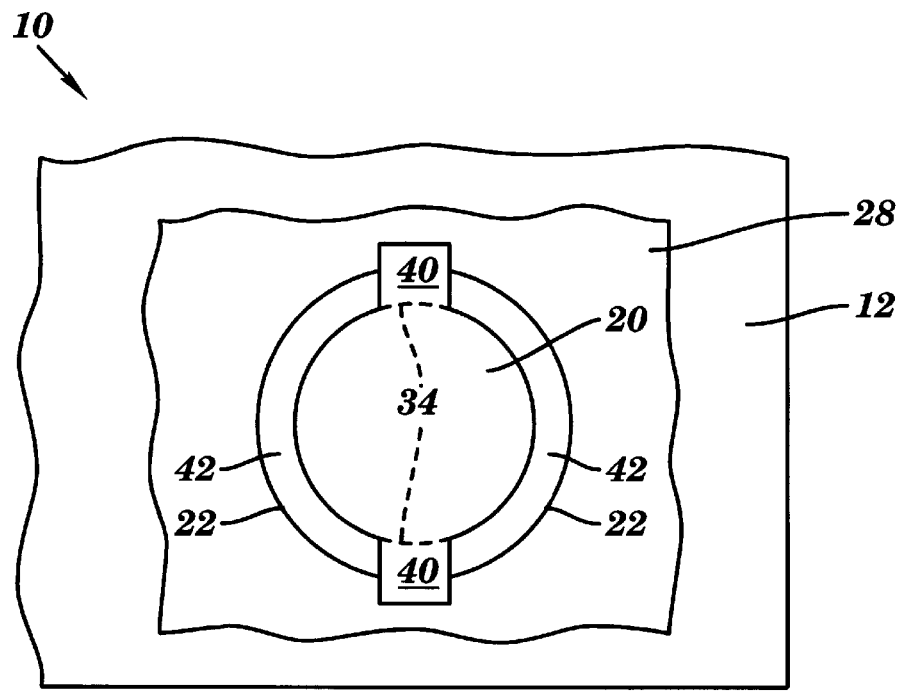
FIG. 4 depicts a top view of the circuit board of FIG. 1 following laser scanning.
Figure 5:
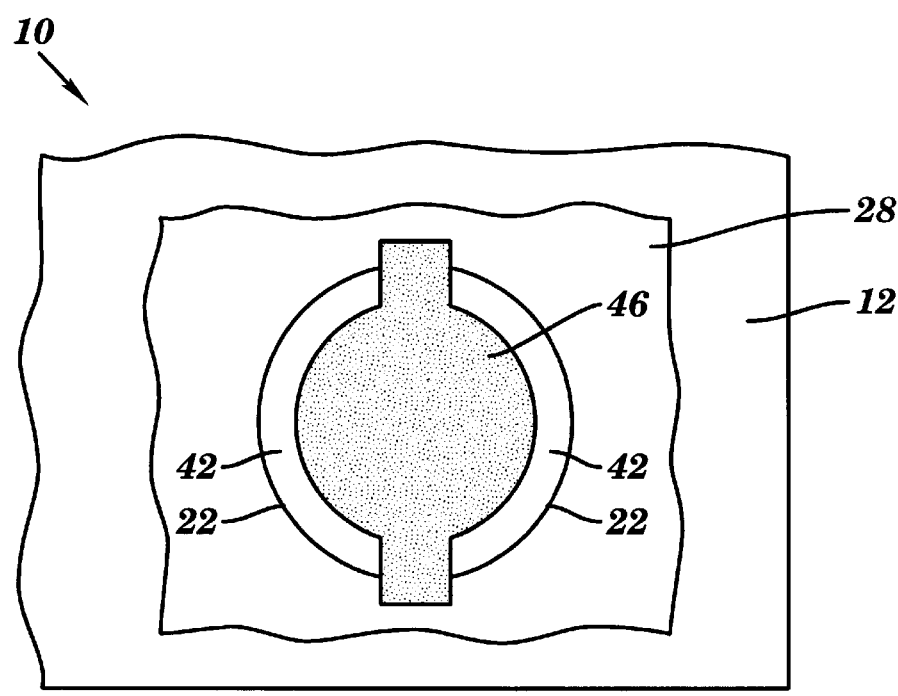
FIG. 5 depicts a top view of the circuit board of FIG. 1 following filling the hole with nonconductive material.

The removal of vertical strips 34 creates isolating gaps 40 and conductive segments 42, as shown in the top view of FIG. 4. The dotted lines 34 in FIG. 4 indicate where the vertical strips 34 were located prior to their removal. The isolating gaps 40 alternate between conductive segments 42 and provide insulative separation between conductive segments 42. At least two vertical strips 34 must be removed from the conductive surface 26 so that at least two conductive segments 42 are formed. In general, N conductive segments 42 and N isolating gaps 40 can be formed, where $N \leq 2$. Although FIG. 4 illustrates two conductive segments, there is no theoretical limit to the number N of conductive segments 42 that may be formed by the subtractive process. The practical upper limit to N is application dependent and depends on factors comprising the diameter of the hole 20, the thickness of the conductive surface 26, and the material of the conductive surface 26. For example, a hole diameter of 20 mils is compatible with a configuration of 8 conductive segments 42 of approximately 4 mils in width and isolating gaps 40 of approximately 4 mils in width. In practice, a conductive segment 42 of a given length should be wide enough to have an electrical resistance below design limits so as to provide adequate current-carrying capability.

In order to assure removal of all conductive material associated with the vertical strips 34, the laser beam 32 creates isolating gaps 40 by penetrating into the substrate insulative material beyond the thickness of the conductive material of the vertical strip 34, as shown in FIG. 4. In removing both conductive and insulative matter, debris is created and some of the debris is deposited on surfaces within the isolating gaps 40. This deposited debris must be removed, because conductive debris deposited on the isolating gap surfaces may destroy the ability of the isolating gaps 40 to provide effective electrical insulation between conductive segments 42. Any of a variety of processes, such as a process comprising vacuuming, abrasive cleaning, or chemical removal may be used to remove the debris. After the debris is removed, the conductive segments 42 may be secured by placing insulative material within the hole 20. For example, the hole 20 and the isolating gaps 40 may be filled with insulative material, resulting in the configuration shown in FIG. 5. U.S. Pat. No. 5,487,218 (Bhatt et al., Jan. 30, 1996), which is hereby incorporated by reference, teaches an applicable hole-filling process. It should be understood that the present invention could utilize U.S. Pat. No. 5,487,218 for filling the hole 20 with insulative material even though the actual filling material used in U.S. Pat. No. 5,487,218 is conductive material.

Figure 6:
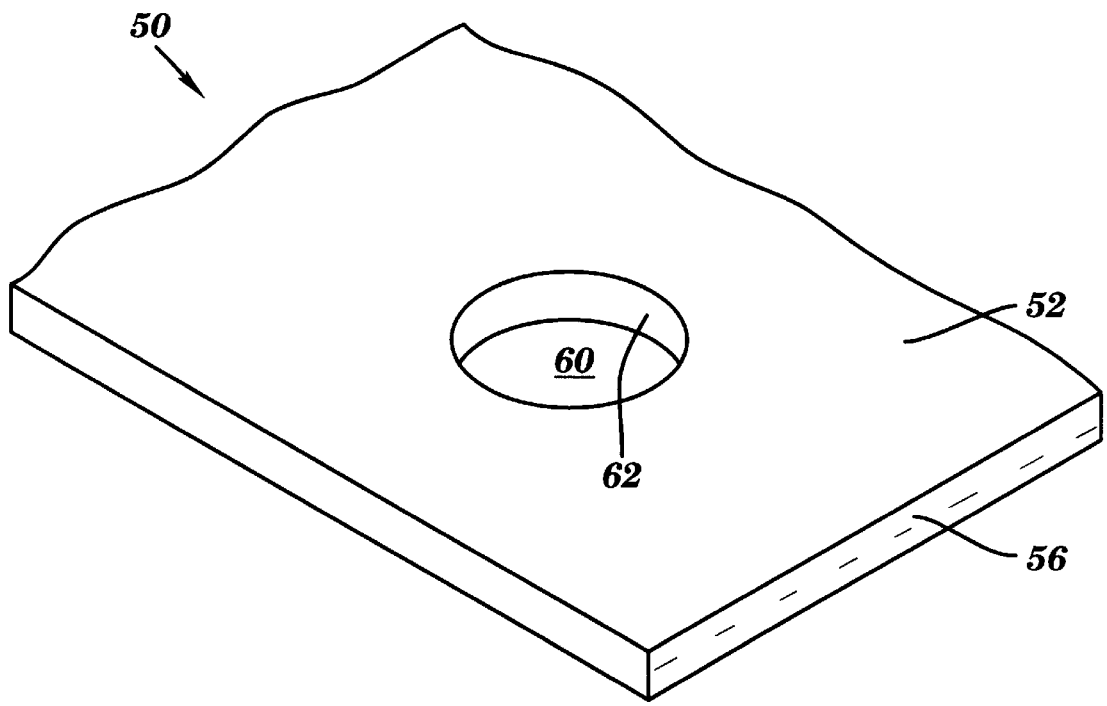
FIG. 6 depicts a top perspective view of a simplified circuit board with a hole in accordance with the additive process embodiment of the present invention.

FIG. 6 relates to the additive process of the present invention and illustrates a top perspective view of a substrate 50 having a first surface 52, an internal layer 56, and a hole 60 circumscribed by a hole wall 62. The first surface 52, internal layer 56, and hole wall 62 each comprise electrically insulating material.

Figure 7:
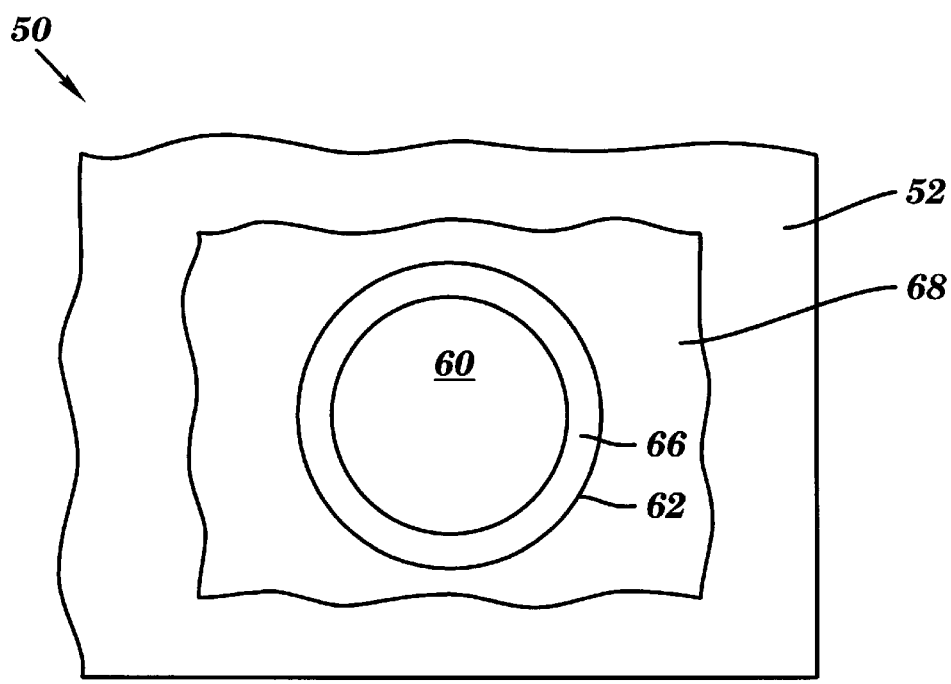
FIG. 7 depicts a top view of the circuit board of FIG. 6 after being coated with seeding material.

Referring to the top view of the substrate depicted in FIG. 7, the first surface 52 and the hole wall 62 are coated with a seeding material to form a coating of seeding material 66 on the hole wall 62 and a layer of seeding material 68 on the first surface 52. The seeding material must have the property of attracting, and bonding with, a plating solution containing an electrically conductive material. An example of an acceptable seeding material is one comprising a palladium-tin colloidal mixture. The seeding serves to facilitate subsequent plating of hole wall 62 with conductive material as part of the process of forming multiple conductive segments in the hole. The seeding also serves to facilitate subsequent plating of the first surface 52 with conductive material followed by circuitization of the first surface 52. Seeding and subsequent coating with conductive material of the first surface 52 is optional and the generation of multiple conductive segments in the hole 60 may be accomplished as described herein even if the first surface 52 is not seeded and not subsequently plated with conductive material.

Figure 8:
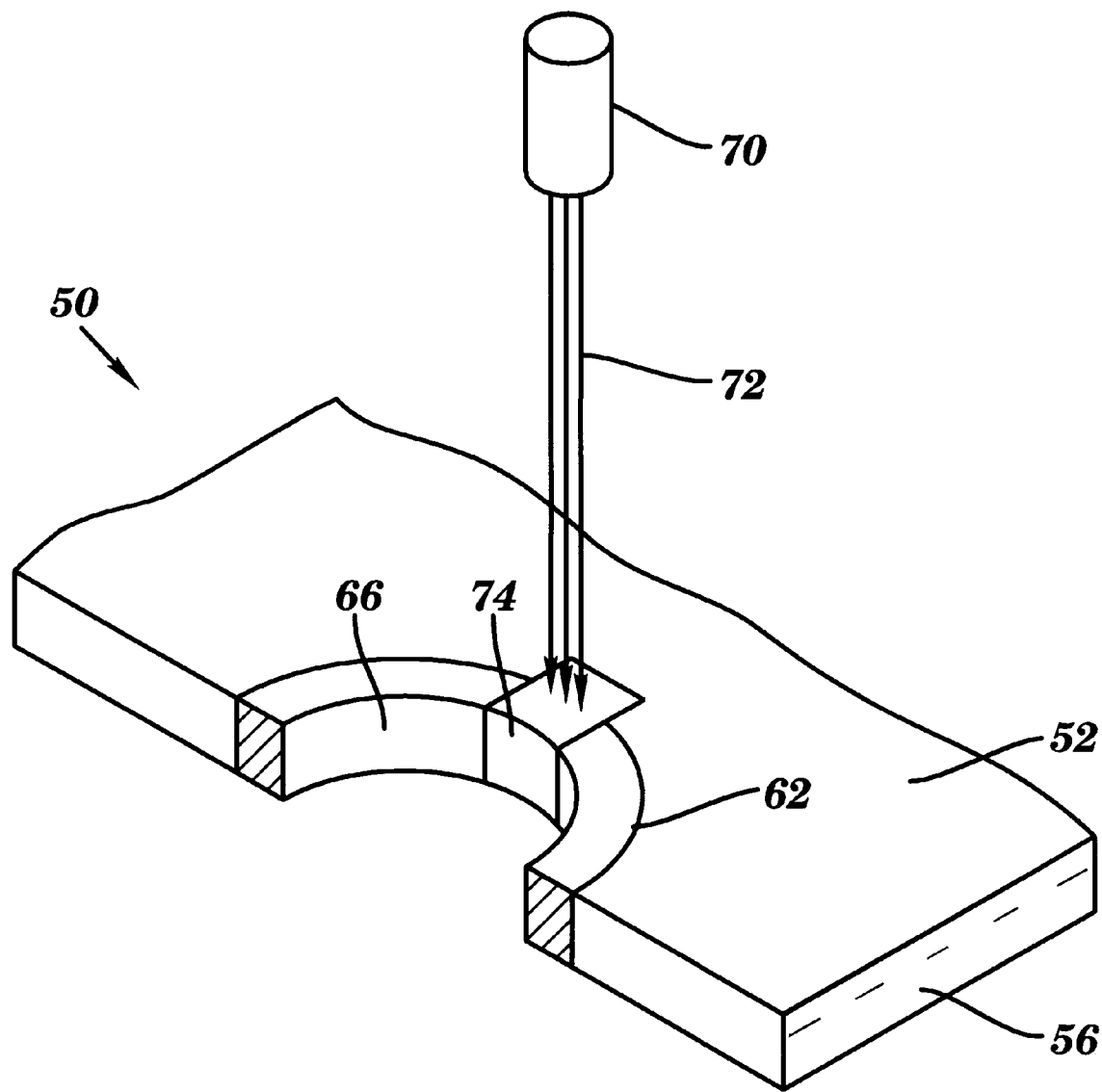
FIG. 8 depicts an isometric cross-sectional view of the circuit board of FIG. 6 at the onset of laser scanning.

FIG. 8 depicts an isometric cross-sectional view of the substrate 50 after the seeding of the hole wall 62 and (optionally) the first surface 52. In FIG. 8, a vertical strip 74 within the coating of seeding material 66 is removed by a beam of light 72 directed from a laser 70 onto the vertical strip 74. Prior to its removal, the vertical strip 74 is an integral part of the coating of seeding material 66. The choice of laser is flexible so long as the laser is capable of cleanly removing the vertical strip 74. The preferred embodiment utilizes the same yag laser discussed previously in the description of the subtractive process.

The removal of vertical strips 74 creates isolating gaps 80 and seeded segments 82, as shown in the top view of FIG.

9 The seeded segment 82 will be transformed into electrically conductive segments in a subsequent step. The dotted lines 74 in FIG. 9 indicate where the vertical strips 74 were located prior to their removal. The isolating gaps 80 alternate between seeded segments 82 and provide separation between seeded segments 82. In light of the subsequent step (to be described) of plating the seeded segments 82 with conductive material, at as least two vertical strips 74 must be removed from the coating of seeding material 66 so that at least two conductive segments may be formed.

Figure 9:
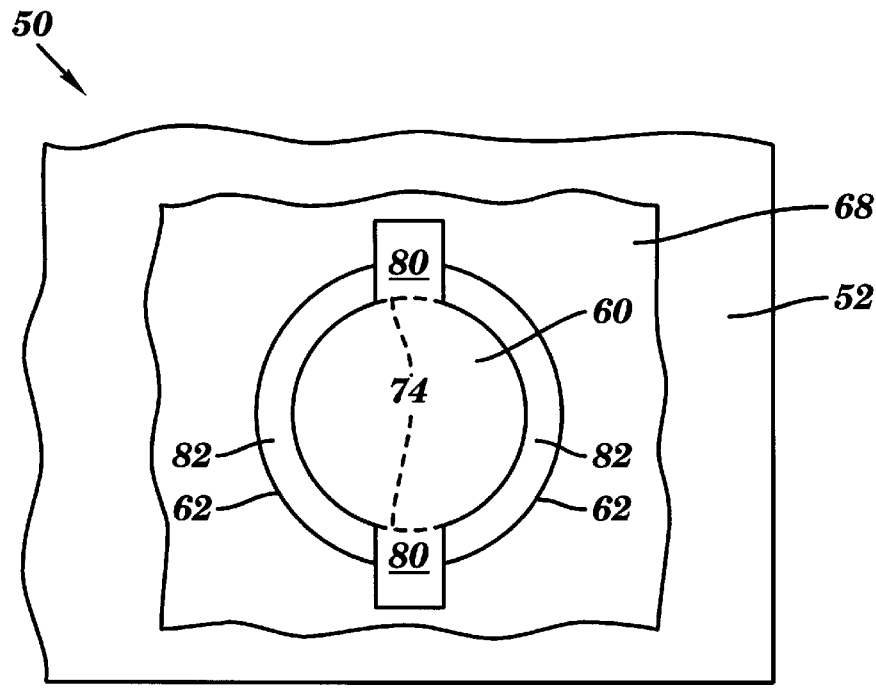
FIG. 9 depicts a top view of the circuit board of FIG. 6 following laser scanning.

In order to assure removal of all seeded material associated with the vertical strips 74, the laser beam 72 creates isolating gaps 80 by penetrating into the substrate insulative material beyond the thickness of the seeding material of the vertical strip 74, as shown in FIG. 9. In removing both seeded matter and insulative matter, debris is created. If desired, the debris may be removed by any suitable process.

Figure 10:
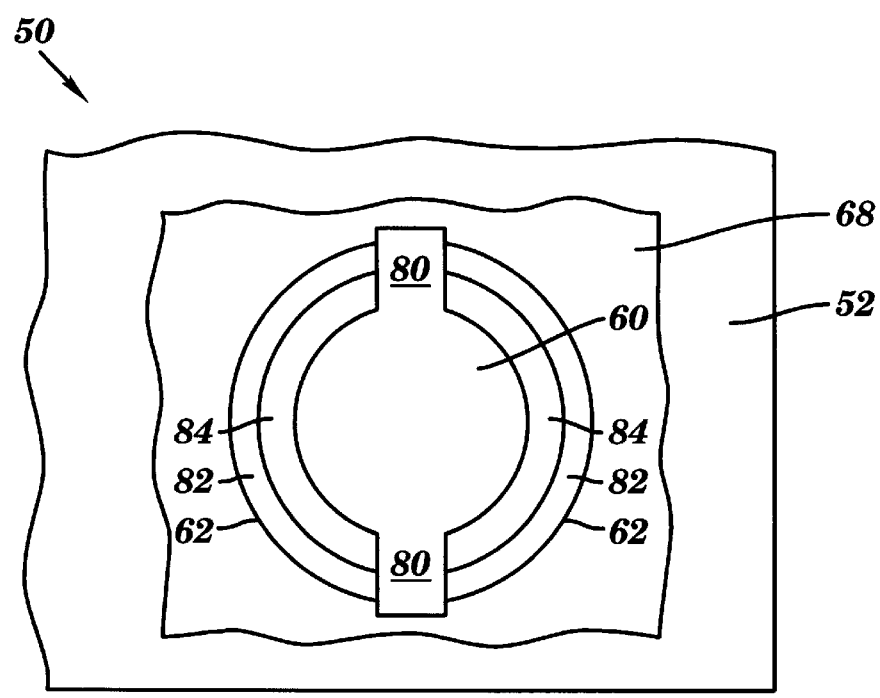
FIG. 10 depicts a top view of the circuit board of FIG. 6 showing conductive segments.
Figure 11:
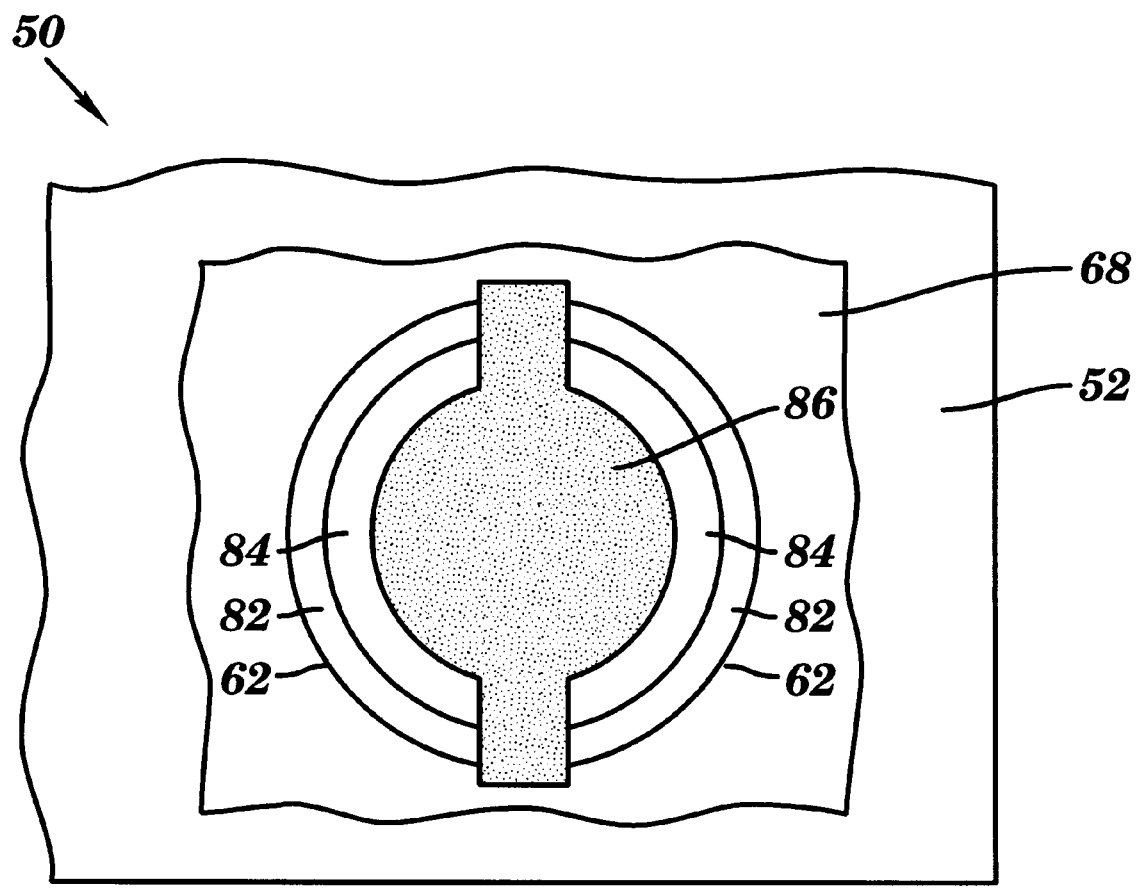
FIG. 11 depicts a top view of the circuit board of FIG. 6 following filling the hole with nonconductive material.

The next step is to plate both the seeded segments 82 and the layer of seeding material 68 with a conductive material to form conductive segments 84, as illustrated in FIG. 10. The conductive material adheres to the seeded surfaces of the seeded segments 82 because of the bonding property of the seeding material as noted previously. The conductive material does not adhere to the surfaces of the isolating gaps 80 because of the absence of seeding material. Thus, the isolating gaps 80 serve to provide insulative separation between seeded segments 82 in a manner similar to that of the subtractive process.

The conductive material adheres (not shown) to the seeded surfaces of the layer of seeding material 68 because of the bonding property of the seeding material as noted previously. The plating of the first surface 52 with a conductive material and subsequent step (to be described) of circuitizing the first surface 52 are optional, as discussed previously. The plating of the hole wall 62 and the first surface 52 may be accomplished simultaneously by a process comprising immersing the substrate 50 in a bath of the electrically conductive material. Alternatively, the hole wall 62 and the first surface 52 may be plated independently. The first surface 52 may be circuitized in any manner after being plated.

After the conductive segments 84 are formed, the conductive segments 84 are secured by placing insulative material within the hole 60. For example, the hole 60 and the isolating gaps 80 may be filled with insulative material, resulting in the configuration shown in FIG. 11.

An alternative embodiment of either the subtractive process or the additive process comprises having an electrical circuit pattern within the internal layer (16 or 56) such that the conductive segments generated in the PTH are electrically joined to the electrical circuit pattern of the internal layer (16 or 56).

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A process for circuitizing a hole in a printed circuit board, comprising the steps of:

providing a substrate comprising: a first surface and a hole, wherein the hole comprises a hole wall, and wherein the first surface and hole wall each comprise a first electrically insulative material;

plating a portion of the hole wall with an electrically conductive material to form a conductive surface on the hole wall; and removing a portion of the conductive surface by directing radiation onto the portion of the conductive surface to form a plurality of unconnected conductive segments on the hole walls;

wherein the removing step comprises removing via the radiation a portion of the first electrically insulative material located underneath the portion of the conductive surface, and wherein a plurality of isolating gaps circumscribing the hole is formed such that the isolating gaps alternate with the unconnected conductive segments.

2. The process of claim 1, further comprising securing the unconnected conductive segments in place by placing a second electrically insulative material within the hole.

3. The process of claim 1, wherein the radiation in the removing step is light generated by a laser.

4. The process of claim 1, wherein the radiation in the removing step is light generated by a yag laser.

5. The process of claim 1, wherein after the removing step eliminating debris from a surface of the isolating gaps, wherein the debris was generated during the removing step and deposited on the surface of the isolating gaps, and wherein the debris comprises particles of the electrically conductive material.

6. The process of claim 1, wherein the substrate comprises an internal layer, wherein the plating step creates electrical coupling between the hole wall and an electrical circuit pattern within the internal layer, and wherein the unconnected conductive segments formed in the removing step are electrically joined to the electrical circuit pattern.

7. A process for circuitizing a hole in a printed circuit board, comprising the steps of:

providing a substrate comprising: a first surface and a hole, wherein the hole comprises a hole wall, wherein the first surface and the hole wall each comprise a first electrically insulative material, and wherein the first surface is coated with a first electrically conductive material;

plating with a second electrically conductive material both a portion of the first surface and a portion of the hole wall to form a conductive layer on the first surface and a conductive surface on the hole wall, wherein the conductive layer is electrically joined to the conductive surface; and removing a portion of the conductive surface by directing light from a laser onto the conductive surface to form a plurality of unconnected conductive segments on the hole wall, wherein the conductive layer is electrically joined to the unconnected conductive segments.

8. The process of claim 7, further comprising securing the unconnected conductive segments in place by placing a second electrically insulative material within the hole.

9. The process of claim 7, wherein the laser in the removing step is a yag laser.

10. The process of claim 7, wherein the removing step comprises removing via the radiation a portion of the first electrically insulative material located underneath the portion of the conductive surface, and wherein a plurality of isolating gaps circumscribing the hole is formed such that the isolating gaps alternate with the unconnected conductive segments;

and further comprising after the removing step eliminating debris from a surface of the isolating gaps, wherein the debris was generated during the removing step and deposited on the surface of the isolating gaps, and wherein the debris comprises particles of the second electrically conductive material.

11. The process of claim 7, further comprising circuitizing the first surface after the plating step.

12. A process for circuitizing a hole in a printed circuit board, comprising the steps of:

provging a substrate comprising: a first surface and a hole, wherein the hole comprises a hole wall, and wherein the first surface and the hole wall each comprise a first electrically insulative material;

coating a portion of the hole wall with a seeding material to form seeding material coating, wherein the seeding material is bondable with an electrically conductive material;

removing a portion of the seeding material coating by directing radiation onto the portion of the seeding material coating to form a plurality of unconnected seeded segments on the hole wall; and plating a portion of the hole wall with the electrically conductive material, wherein the electrically conductive material adheres to only the unconnected seeded segments, and wherein a plurality of unconnected conductive segments are formed.

13. The process of claim 12, further comprising securing the unconnected conductive segments in place by placing a second insulative material within the hole.

14. The process of claim 12, wherein the radiation in the removing step is light generated by a laser.

15. The process of claim 12, wherein the radiation in the removing step is light generated by a yag laser.

16. The process of claim 12, wherein the removing step comprises removing via the radiation a portion of the first electrically insulative material located underneath the seeding material coating, and wherein a plurality of isolating gaps circumscribing the hole is formed such that the isolating gaps alternate with the unconnected seeded segments.

17. The process of claim 12, wherein the substrate comprises an internal layer, wherein the coat of seeding material formed in the coating step is in contact with an electrical circuit pattern within the internal layer, and wherein the unconnected conductive segments formed in the plating, step are electrically joined to the electrical circuit pattern.

18. A process for circuitizing a hole in a printed circuit board, comprising the steps of:

providing a substrate comprising: a first surface and a hole, wherein the hole comprises a hole wall, and wherein the first surface and the hole each comprise a first electrically insulative material;

coating both a portion of the first surface and a portion of the hole wall to form a layer of seeding material on the first surface and a coat of seeding material on the hole wall, wherein the layer of seeding material and the coating of seeding material are joined, and wherein the seeding material is bondable with an electrically conductive material;

removing a portion of the coat of seeding material by directing light from a laser onto the portion of the coat of seeding material to form a plurality of unconnected seeded segments on the hole wall such that the plurality of unconnected seeded segments touches the layer of seeding material; and plating a portion of the hole wall with the electrically conductive material, wherein the electrically conductive material adheres only to the unconnected seeded segments and to the layer of seeding material, wherein a plurality of unconnected conductive segments is formed, and wherein the first surface is electrically joined to the unconnected conductive segments.

19. The process of claim 18, further comprising securing the unconnected conductive segments in place by placing a second insulative material within the hole.

20. The process of claim 18, wherein the laser in the removing step is a yag laser.

21. The process of claim 18, wherein the removing step comprises removing via the radiation a portion of the first electrically insulative material located underneath the coat of seeding material, and wherein a plurality of isolating gaps circumscribing the hole is formed such that the isolating gaps alternate with the unconnected conductive segments.

22. The process of claim 18, further comprising circuitizing the first surface after the plating step.

* * * * *